United States Patent
Tokorozuki et al.

(10) Patent No.: US 6,797,442 B2
(45) Date of Patent: Sep. 28, 2004

(54) FABRICATION METHOD OF SEMICONDUCTOR INTEGRATED CIRCUIT DEVICE

(75) Inventors: Kazuyuki Tokorozuki, Hitachinaka (JP); Tetsuji Yokouchi, Hitachinaka (JP); Yoshiyuki Miyamoto, Takasaki (JP); Koji Yamamoto, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/614,789

(22) Filed: Jul. 9, 2003

(65) Prior Publication Data

US 2004/0029369 A1 Feb. 12, 2004

(30) Foreign Application Priority Data

Aug. 8, 2002 (JP) .......................... 2002-230865

(51) Int. Cl.$^7$ ................................. G03F 9/00
(52) U.S. Cl. ........................ 430/5; 430/492.2
(58) Field of Search ............................. 430/5, 22, 30, 430/311, 313, 492.2

(56) References Cited

U.S. PATENT DOCUMENTS 6,649,310 B2 * 11/2003 Itoh et al. ...................... 430/5

* cited by examiner

Primary Examiner—David Nelms
Assistant Examiner—David Vu
(74) Attorney, Agent, or Firm—Miles & Stockbridge P.C.

(57) ABSTRACT

An average value of dimensions of resist patterns formed each time exposure processing is effected on semiconductor substrates of a predetermined number of lots, is compared with a target dimension. When a drift between each of the dimensions of the formed resist patterns and the target dimension is larger than a first value, exposure energy is corrected with a relatively large correction value $\alpha_1$. When the drift between each of the dimensions of the formed resist patterns and the target dimension is smaller than the first value and larger than a second value, exposure energy is corrected with a relatively small correction value $\alpha_2$. When the drift between each of the dimensions of the formed resist patterns and the target dimension is smaller than the second value, no exposure energy is corrected. Exposure processing is effected on a semiconductor substrate of the next lot by using the calculated exposure energy.

3 Claims, 7 Drawing Sheets

FABRICATION METHOD OF SEMICONDUCTOR INTEGRATED CIRCUIT DEVICE

BACKGROUND OF THE INVENTION

The present invention relates to a technology for fabricating a semiconductor device, and particularly to a technology effective for application to a technology for manufacturing a semiconductor device, using a photolithography method.

A process for manufacturing a semiconductor device includes a number of photolithography process steps for patterning a material film formed on a semiconductor wafer into desired shapes. In the photolithography process step, a resist (photoresist) film is applied or formed onto the material film lying on the semiconductor wafer and exposed by an exposure system (stepper). The stepper applies light from above a glass surface on which circuit patterns called reticles are drawn, and thereby form exposed and non-exposed portions on the resist film according to the applied light energy (exposure energy). Thereafter, the development thereof is done by a coating developing apparatus so that each resist pattern (photoresist pattern) having a predetermined shape is formed on the semiconductor wafer. Using the formed resist pattern as an etching mask, the material film on the semiconductor wafer is etched so that the material film formed on the semiconductor wafer can be patterned into desired shapes.

SUMMARY OF THE INVENTION

The dimension (open dimension or line width) of the resist pattern formed in the corresponding photolithography process step can be controlled with satisfactory reproducibility by the exposure energy applied onto the resist film. However, variations in semiconductor manufacturing equipment with time, the state thereof, or factors resultant from a resist film material or the like conspire to cause the formed resist pattern to vary with given fluctuations even if the exposure energy supplied from the exposure system is constant. Since the formed resist pattern goes through an etching process step and is thereby brought into a semiconductor circuit pattern, a defective product or item is developed when the dimension of the formed resist pattern much drifts from a target (intended) dimension. When the dimension of the resist pattern varies widely even though the dimension thereof is not much shifted from the target dimension, such variations might exert an influence on the operating speed and refresh characteristics or the like of a semiconductor device because the semiconductor device is operated in a fine circuit pattern. This will degrade production yields of the semiconductor device and increase the manufacturing cost of the semiconductor device.

Therefore, when the dimension of the formed resist pattern is drifting from the target dimension, there is a need to correct exposure energy and modify the dimension of the resist pattern. Namely, a decision as to whether it is necessary to correct the exposure energy, is made after the completion of exposure processing on a semiconductor wafer of a certain lot. If need be, then the exposure energy is corrected and exposure processing of a semiconductor wafer of the next lot is performed with the corrected exposure energy.

As a method of automatically correcting and controlling exposure energy of the exposure system such that the dimension of each resist pattern reaches a target dimension, the following two are considered.

As the first method, it is considered that a ratio $a_1$ ($a_1 = \Delta W / \Delta E$) of the amount of change in dimension of each resist pattern ($\Delta W$) to the amount of change in exposure energy ($\Delta E$) is quantified and set in advance, and the amount of correction of the exposure energy ($\Delta E_d$) is determined from the difference ($W_d$) between the dimension of the resist pattern and the target dimension ($\Delta E_d = W_d / a_1$), thereby correcting the exposure energy.

According to the present method, exposure processing is effected on a resist film formed on a semiconductor wafer of a given lot. If the dimension of each formed resist pattern is drifting from the target dimension, then the exposure energy is corrected by the amount of exposure energy (calculated by $\Delta E_d = W_d / a_1$) corresponding to the drift ($W_d$) of the dimension of the resist pattern from the target dimension, and exposure processing is effected on a resist film on a semiconductor wafer of the next lot with the corrected exposure energy. Therefore, when the accuracy of a set value of above ratio $a_1$ is high, the dimension of the formed resist pattern quickly converges on the target dimension and hence its followability is satisfactory. However, there is the fear that when the accuracy of the set value of above ratio $a_1$ is low, the dimension of the formed resist pattern does not converge on the target dimension, and the dimension of each resist pattern formed with the corrected exposure energy overshoots the target dimension, for example, so the dimension of the resist pattern does not approach the target dimension in spite of any correction. Thus, there is a need to improve the accuracy of the set value of the ratio $a_1$ of the amount of change in dimension of the resist pattern to the amount of change in exposure energy. To this end, however, it is necessary to set parameters such as the type of resist, a process type (state of the surface of a semiconductor wafer), a target dimension, the amount of exposure based on lens aberration, a dimension linearity region, etc. Therefore, the present method is not suitable for production lines on which a small volume and wide variety of semiconductor devices are mass-produced. The manufacturing cost of the semiconductor device also increases. Since these parameters vary widely according to resist sensitivity, there is no guarantee that even if a strict experiment is done once to set parameters, the parameters remain unchanged on a permanent basis. Therefore, it is not easy to stably form resist patterns having dimensions which fall within a predetermined standard.

As the second method, it is considered that the amount of exposure energy ($\Delta E_1$) to be changed once is set to a relatively small value so as not to diverge, and the exposure energy is adjusted $\Delta E_1$ by $\Delta E_1$ at a time until the dimension of each resist pattern falls within a predetermined standard range.

According to the present method, exposure processing is effected on a resist film formed on a semiconductor wafer of a given lot. If the dimension of each formed resist pattern falls beyond the predetermined standard range, then the exposure energy is corrected by the relatively small amount ($\Delta E_1$) determined in advance, and exposure processing is effected on a resist film on a semiconductor wafer of the next lot with the corrected exposure energy. Since the amount of exposure energy to be changed at a time is small, the dimension of each formed resist pattern can be fine-adjusted. Therefore, the dimensions of the resist patterns formed as in the first method do not diverge. Owing to the setting of the amount of exposure energy to be changed at a time at the rate (e.g., 1%) to the amount of exposure energy, set parameters can be minimized in the case of production lines for a small volume and wide variety of semiconductor devices, and hence the present method is suited for a mass-production process. Since, however, the amount of exposure energy to be changed at a time is small, the convergence of the dimension of each formed resist pattern on the target dimension is slow and its followability is poor where the dimension of the resist pattern is much drifting from the predetermined standard range. It also takes time to cause the dimension of each formed resist pattern to fall within the standard range. There is also a fear of production yields of a semiconductor device being degraded.

An object of the present invention is to provide a method of manufacturing a semiconductor device, which is capable of improving the dimensional accuracy of a resist pattern.

Another object of the present invention is to provide a method of manufacturing a semiconductor device, which is capable of stably fabricating resist patterns having dimensions each falling within a predetermined standard.

A further object of the present invention is to provide a method of manufacturing a semiconductor device, which is capable of shortening manufacturing time and enhancing production yields.

A still further object of the present invention is to provide a method of manufacturing a semiconductor device, which is suitable for mass production.

The above, other objects and novel features of the present invention will become apparent from the description of the present specification and the accompanying drawings.

A summary of a representative one of the inventions disclosed in the present application will be explained in brief as follows:

There is provided a method of fabricating a semiconductor device, according to the present invention, which comprises the steps of increasing the amount or rate of exposure energy to be corrected when the dimension of each formed resist pattern is much drifting from a target dimension and decreasing the amount or rate of exposure energy to be corrected after the dimension of each formed resist pattern has approached the target dimension.

DETAILED DESCRIPTION OF THE PREFERRED EMBODIMENTS

Figure 1:
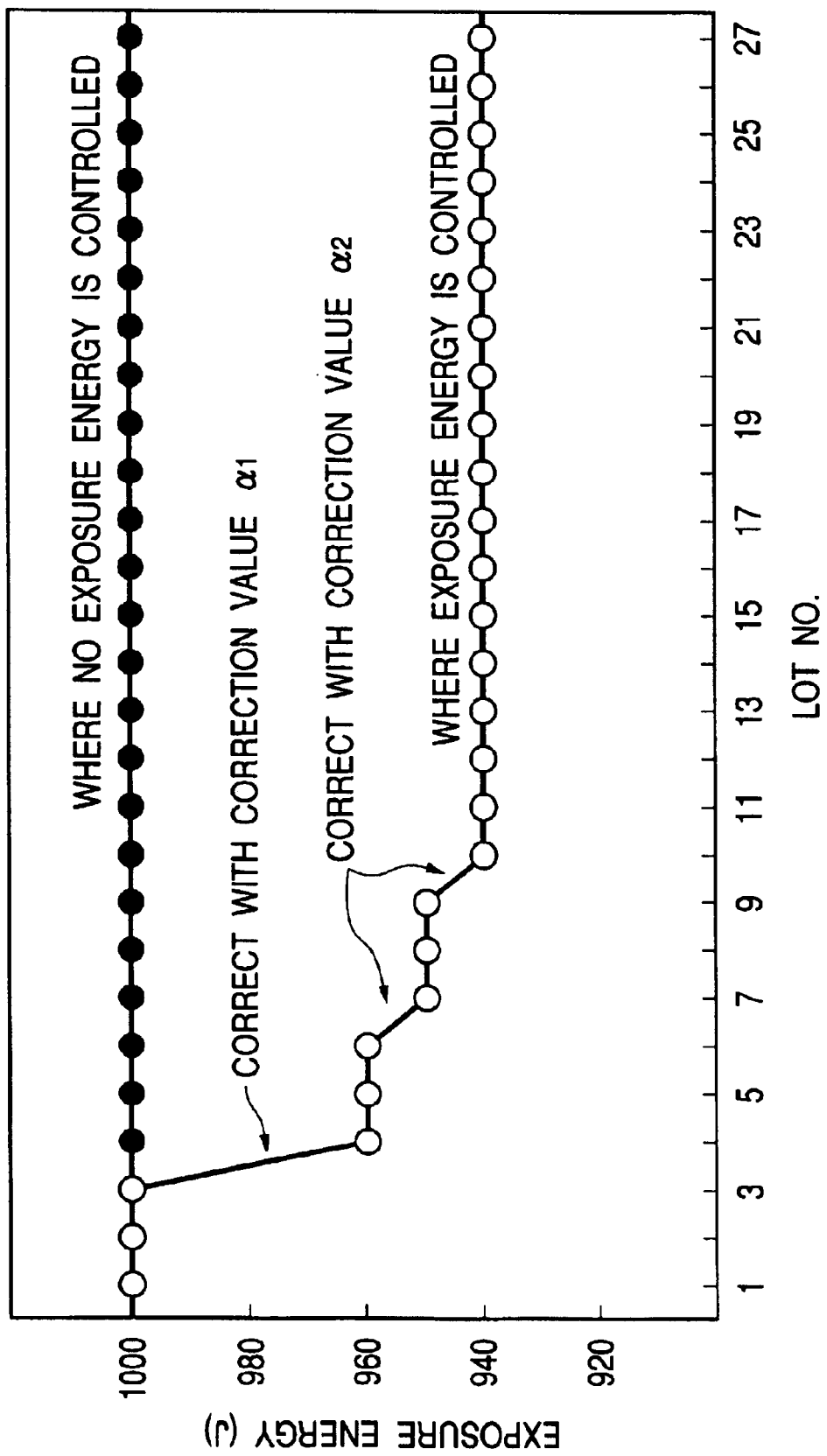
FIG. 1 is a graph for describing a method of controlling exposure energy used upon exposure of a resist film on a semiconductor substrate in a process for manufacturing a semiconductor device, according to one embodiment of the present invention.

Preferred embodiments of the present invention will hereinafter be described in detail with reference to the accompanying drawings. Incidentally, components or members each having the same function in all the drawings for describing the embodiments are respectively identified by the same reference numerals and their repetitive description will therefore be omitted. Except for cases required in particular, the description of the same or similar portions will not be repeated in principle.

(First Embodiment)

A method of controlling exposure energy (light energy) when resist patterns (photoresist patterns) are formed in a process for manufacturing a semiconductor device, according to one embodiment of the present invention, will be described with reference to the accompanying drawings. While the exposure energy controlling method according to the present embodiment can be applied to a case in which resist patterns of various shapes are formed, it can be applied to, for example, a case in which resist patterns for defining contact holes or through holes in an insulating film or the like on a semiconductor wafer (semiconductor substrate) are formed.

Figure 2:
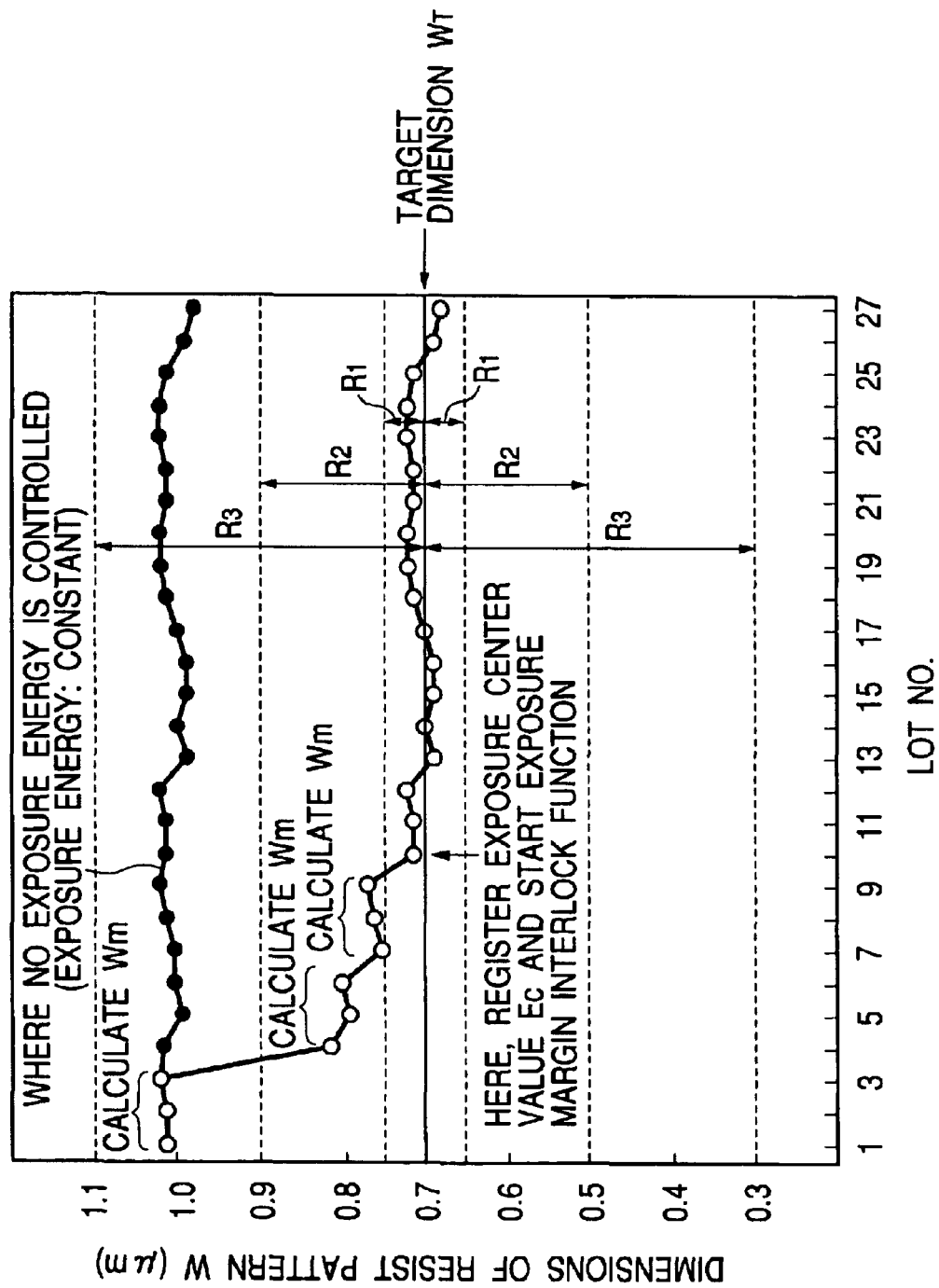
FIG. 2 is a graph showing dimensions of resist patterns formed by irradiation of the exposure energy shown in FIG. 1.
Figure 3:
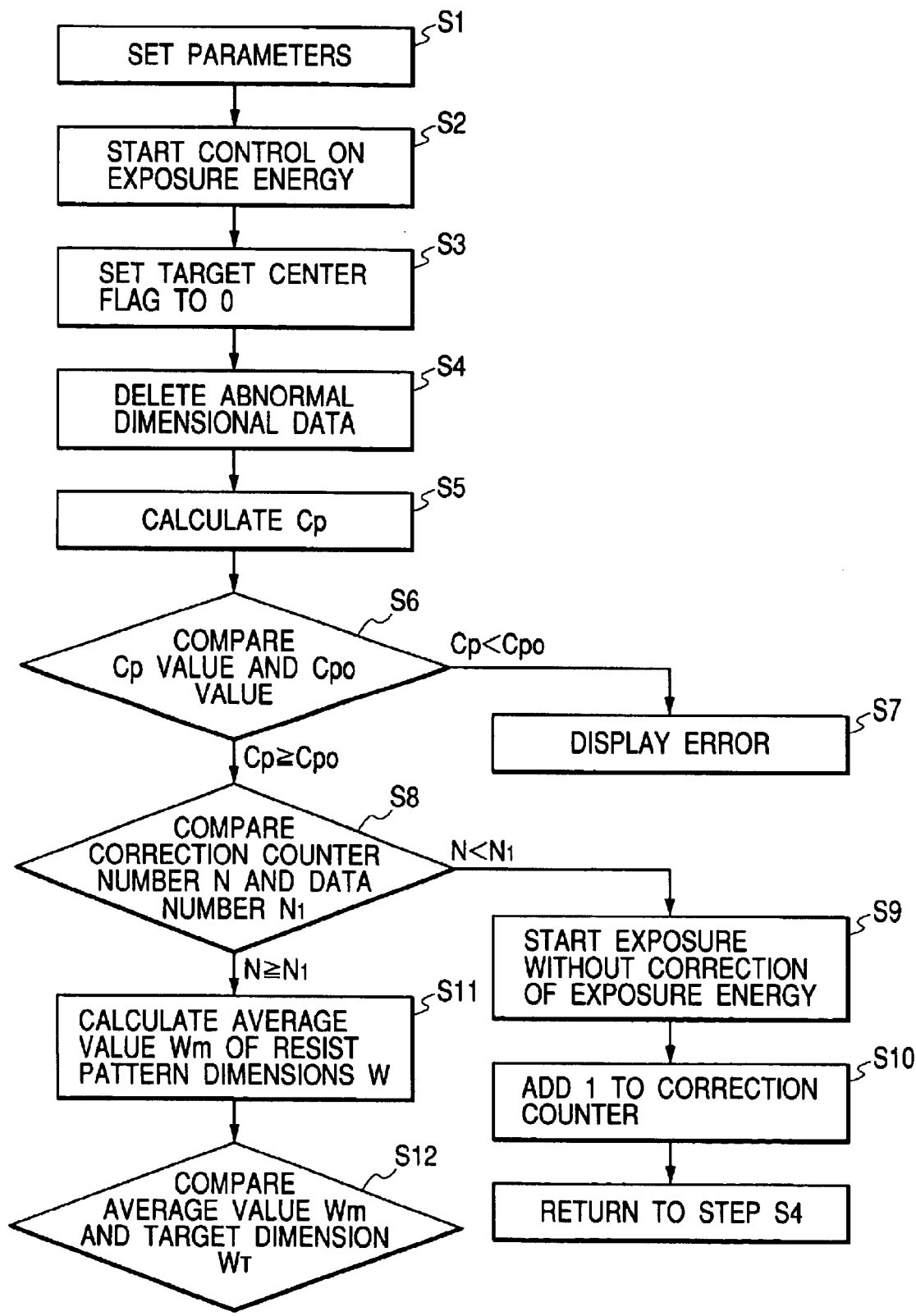
FIG. 3 is a flowchart for describing the exposure energy controlling method in the semiconductor device manufacturing process according to the one embodiment of the present invention.
Figure 4:
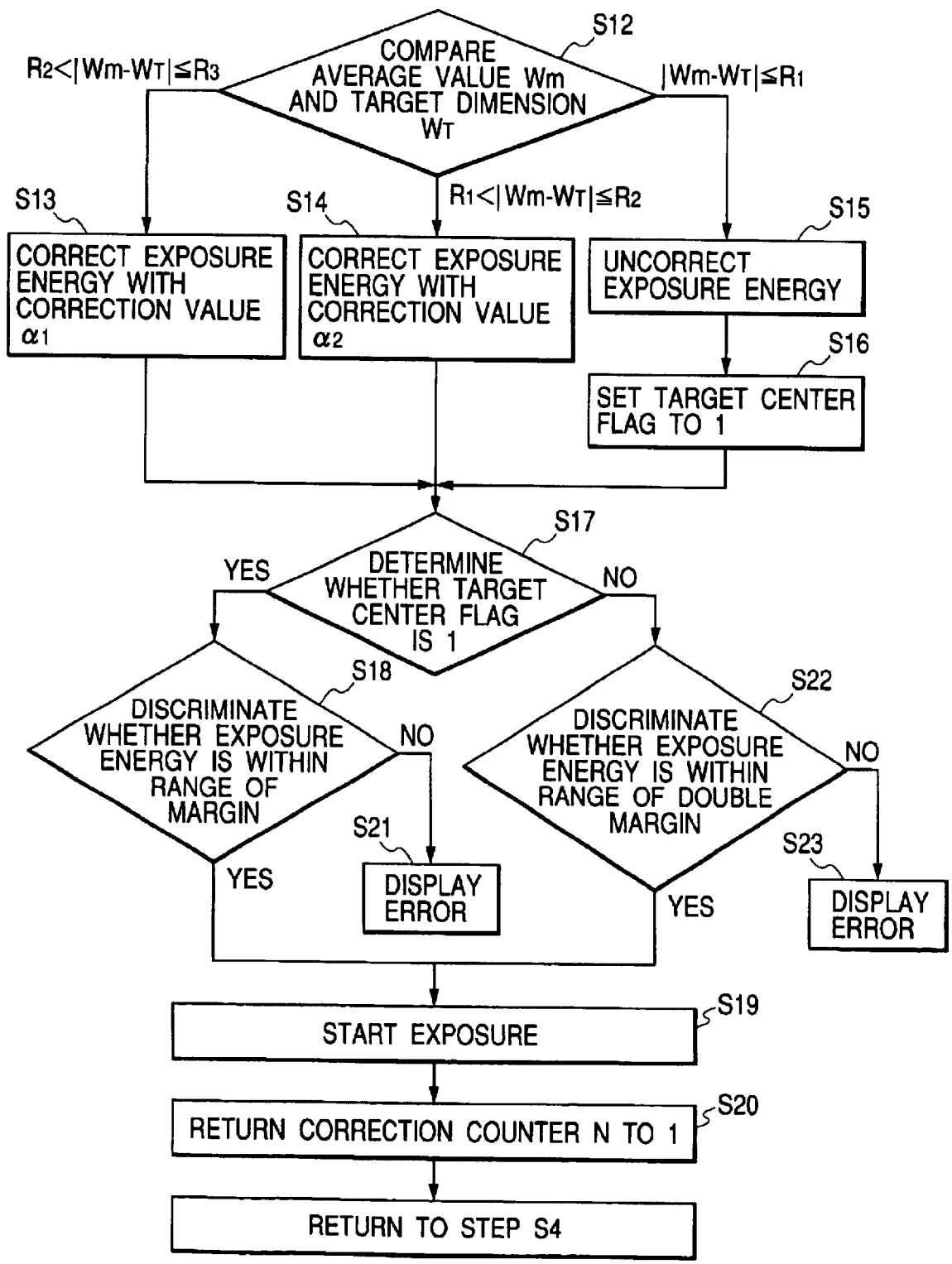
FIG. 4 is a flowchart for describing the exposure energy controlling method in the semiconductor device manufacturing process according to the one embodiment of the present invention.

FIG. 1 is a graph for describing a method of controlling exposure energy when a resist (photoresist) film on a semiconductor substrate (semiconductor wafer) is exposed. FIG. 2 is a graph showing dimensions of resist patterns formed by irradiation of the exposure energy shown in FIG. 1. FIGS. 3 and 4 are respectively flowcharts for describing the exposure energy controlling method or control logic in the semiconductor device manufacturing process according to the present embodiment. The horizontal axes of the graphs shown in FIGS. 1 and 2 respectively correspond to lot numbers (lot NOs.) of exposed semiconductor substrates (semiconductor wafers). The vertical axis of the graph shown in FIG. 1 corresponds to exposure energy (light energy or amount of exposure) applied (given) to the semiconductor substrates of the respective lot numbers. The vertical axis of the graph shown in FIG. 2 corresponds to dimensions W of resist patterns formed on the semiconductor substrates of the respective lot numbers by being irradiated with the exposure energy in the graph of FIG. 1, e.g., dimensions of openings of resist patterns for defining contact holes or through holes in a material film (insulating film) provided below a resist film. In the case of resist patterns for forming wiring patterns, the vertical axis corresponds to dimensions of line widths of the resist patterns. Incidentally, a case in which exposure processing is done using the exposure energy controlling method according to the present embodiment (expressed in white circles) and a case in which exposure processing is done according to constant exposure energy without performing control on the exposure energy (expressed in black circles) are described in the graphs shown in FIGS. 1 and 2.

In a photolithography process step, a resist film formed on a semiconductor substrate of a lot NO. 1 is exposed by an exposure system (stepper), followed by development thereof. Thereafter, the dimension W of a formed resist pattern is measured. A resist film formed on a semiconductor substrate of a lot NO. 2 is exposed and developed, followed by measurement of the dimension W of a formed resist pattern. Such an operation is repeated so that resist patterns are formed even on semiconductor substrates of a lot NO. 3 and later. In the present embodiment, the semiconductor substrate (semiconductor wafer) of each lot is subjected to exposure processing while exposure energy is being controlled to a suitable value upon exposure processing of such a photolithography process step. Incidentally, the semiconductor substrate of each lot may be made up of one or a plurality of semiconductor substrates. When the semiconductor substrate of each lot is made up of the plural semiconductor substrates, the dimensions W of resist patterns on the semiconductor substrates of the respective lots may be an average value of the dimensions of resist patterns of all the semiconductor substrates constituting the respective lots, an average value obtained by extracting arbitrary plural semiconductor substrates from the respective lots and measuring the dimensions of resist patterns thereof, or a value obtained by extracting one arbitrary semiconductor substrate from the respective lots and measuring the dimension of a resist pattern thereof.

Predetermined parameters are first set in advance before exposure energy is controlled (automatically controlled) in the photolithography process step (Step S1). As the parameters to be set may be mentioned, a target dimension $W_T$ of a resist pattern, set values $R_1$ (dead zone areas), set values $R_2$ (prior spec or standard), set values $R_3$ (body spec or standard), a correction value $\alpha_1$, a correction value $\alpha_2$, the number of data or a data number $N_1$, a data number $N_2$, a $Cp_o$ value, a change amount-of-exposure margin $M_1$, a threshold value $R_4$, etc.

Here, the target dimension $W_T$ corresponds to a target value of the dimension (e.g., dimension of opening of resist pattern) W of each formed resist pattern. In the present embodiment, the target dimension W is set to, for example, 0.7 $\mu$m.

The set value $R_1$ is set to define a dead zone area corresponding to an area in which the dimension W of the formed resist pattern has a margin enough for the standard and if the dimension W of the resist pattern falls within this area, there is no need to correct exposure energy. In the present embodiment, $R_1$ is set to 0.05 $\mu$m, for example. Accordingly, the dead zone area corresponding to an area of $W_T$–$R_1$ to $W_T$+$R_1$ results in a range from 0.65 $\mu$m to 0.75 $\mu$m.

The set value $R_2$ is a center control value of the dimension W of each resist pattern formed on the semiconductor substrate and is set to define an area (prior standard) in which if the dimension W of the resist pattern falls within this range, no problem substantially arises. In the present embodiment, $R_2$ is set to 0.2 $\mu$m, for example. Accordingly, the prior standard corresponding to an area of $W_T$–$R_2$ to $W_T$+$R_2$ results in a range from 0.5 $\mu$m to 0.9 $\mu$m. However, the semiconductor device manufacturing process includes photolithography process steps corresponding to about 30 process steps, for example. There is a possibility that if shifts or drifts in maximum values within the set value R2 (prior standard) are cumulated in the respective photolithography process steps, then it will influence specs (e.g., an operating speed, refresh characteristics, etc.) of a finally-fabricated semiconductor device.

The set value $R_3$ is set to define the maximum allowable range (body standard) of a standard value in a started process step. In the present embodiment, the set value $R_3$ is set to 0.4 $\mu$m, for example. Accordingly, the body standard corresponding to an area of $W_T$–$R_3$ to $W_T$+$R_3$ results in a range of 0.3 $\mu$m to 1.1 $\mu$m. However, the semiconductor device manufacturing process contains photolithography process steps equivalent to about 30 process steps. There is a possibility that if drifts or shifts in maximum values within the set value $R_3$ (body standard) are cumulated in the respective photolithography process steps, then failures in product will finally occur. In such a case, each fabricated semiconductor device is eliminated as a defective product or item in a testing process.

The correction value $\alpha_1$ corresponds to a ratio or proportion (relative value in which pre-change exposure energy or an initial value of exposure energy is set as 100%) of exposure energy to be changed (corrected) once when a drift or shift between the dimension W of each formed resist pattern and the target dimension $W_T$ is relatively large. In the present embodiment, the correction value $\alpha_1$ is set to 4%, for example. The correction value $\alpha_2$ corresponds to a ratio or proportion (relative value in which pre-change exposure energy or an initial value of exposure energy is set as 100%) of exposure energy to be changed (corrected) once when a drift or shift between the dimension W of each formed resist pattern and the target dimension $W_T$ is relatively small. In the present embodiment, the correction value $\alpha_2$ is set to 1%, for example. The correction values $\alpha_1$ and $\alpha_2$ are not necessarily limited to the above values. They can be changed to various values as needed, such as the correction value $\alpha_1$=4%, the correction value $\alpha_2$=2%, the correction value $\alpha_1$=8%, the correction value $\alpha_2$=5%, etc. It should however be noted that the correction value $\alpha_2$ is smaller than the correction value $\alpha_1$ ($|\alpha_2|<|\alpha_1|$) in the present embodiment. Incidentally, the smallness of the correction value $\alpha_2$ than the correction value $\alpha_1$ in the present embodiment means that the correction value $\alpha_2$ and the correction value $\alpha_1$ are of the same sign, and the absolute value of the correction value $\alpha_2$ is smaller than that of the correction value $\alpha_1$. While the correction value $\alpha_1$ and the correction value $\alpha_2$ can be set as the ratio of the amount of change in exposure energy to the pre-change exposure energy as described above. However, they may be set to the absolute value (e.g., the correction value $\alpha_1$=50 J, correction value $\alpha_2$=20 J, correction value $\alpha_1$=200 J, correction value $\alpha_2$=50 J, or the like) of the amount of change in exposure energy.

The data number $N_1$ corresponds to a data number (number of lots) for determining an average value $W_m$ of dimensions W of resist patterns. In the present embodiment, the data number $N_1$ is set to 3, for example. The data number $N_2$ corresponds to a data number (number of lots) for calculating a Cp value (Cp value: process capability index). A relatively large value may preferably be set so as not to influence the post-correction Cp value.

A Cp value expressed as, for example, Cp=|upper limit of body standard—lower limit of body standard|/6$\sigma$ (where $\sigma$: standard deviation in dimension W of resist pattern) increases as it varies small and the range of the body standard becomes wide. When the dimension W of each resist pattern excessively varies due to the process or semiconductor manufacturing apparatus or the like (i.e., Cp becomes excessively small), there is a possibility that a defective product will be made in reverse when exposure energy is automatically corrected. As an interlock for divergence prevention, a $Cp_o$ value is set as a reference value for a Cp value for making a decision as to variations in the dimension W of the resist pattern, and a Cp value calculated from dimensional data about each actual resist pattern is compared with the $Cp_o$ value, whereby a decision as to whether the dimensions vary widely, can be made.

The threshold value $R_4$ is of a threshold value for excluding or deleting abnormal values (abnormal dimensional values) of the dimensions W of the resist patterns.

There is a need to find out the cause of such a phenomenon that the dimension W of each formed resist pattern drifts with time due to the process or semiconductor manufacturing apparatus or the like, and take countermeasures against it. The change amount-of-exposure margin $M_1$ is used to determine whether the corrected amount of exposure energy presents a problem. In the present embodiment, it is set to 5%, for example.

After the setting of the parameters, the control of exposure energy is started (Step S2). At this time, semiconductor substrates of several lots are subjected to exposure processing as needed under constant exposure energy without exerting control on the exposure energy, and the control of the exposure energy according to the present embodiment may be started at an arbitrary stage.

Subsequently, a target center flag is set to 0 (zero) or set (Step S3). This is done to determine such an optimum amount of exposure energy that the dimension W of each resist pattern substantially coincides with the target dimension $W_T$ and move an interlock of ±5% therefrom as will be described later.

Next, abnormal dimensional data (abnormal value) about the dimension W of each resist pattern is deleted using the threshold value $R_4$ (Step S4). Of data about the dimensions W of the resist patterns, the data (abnormal dimensional data) exceeding the threshold value $R_4$ is deleted or excluded to thereby make it possible to prevent the abnormal dimensional data from being contained in calculations of a Cp value and an average value $W_m$ to be described later. Incidentally, an error is displayed if the abnormal dimensional data continues to exist.

Next, the Cp value is calculated from the dimensions W of resist patterns corresponding to a data number $N_2$ (Step S5). Of data about the dimensions W of resist patterns of respective lot numbers, dimensional data of lots corresponding to $N_2$ are selected at this time traceably from the latest lot subjected to exposure processing to thereby calculate a Cp value for the dimension W of the corresponding resist pattern.

Next, the calculated Cp value is compared with a $Cp_o$ value (Step S6). If the Cp value is smaller than the $Cp_o$ value, then an error display is performed (Step S7). There is the fear that since it is noted that variations or fluctuations in the dimension W of each resist pattern are large when the error is displayed here, a defective product or item will be fabricated in reverse if exposure energy is automatically corrected. Therefore, exposure processing is done without automatically correcting the exposure energy. For instance, a test run for putting one semiconductor substrate into a production line precedingly is performed, and if the dimension W of each resist pattern falls within a prior standard, then other semiconductor substrates are also brought into a production line without automatic correction of the exposure energy.

If the Cp value is greater than or equal to the $Cp_o$ value, then a correction counter number N is compared with a data number $N_1$ (Step S8). If the correction counter number N is smaller than the data number $N_1$, then the exposure of a semiconductor substrate of the following lot is executed under the same exposure energy without correcting exposure energy (Step S9). Then 1 is added to the correction counter number N (Step S10). Incidentally, the initial value of the correction counter number N is 1. This is done to prevent the exposure energy from being corrected by the data number $N_1$ (number of lots) after the correction of the exposure energy since an average value $W_m$ of dimensions W of resist patterns is calculated based on the data number $N_1$ to thereby make a decision as to whether exposure energy is proper, as will be described later. Further, a routine procedure is returned to Step S4 to determine exposure energy for a semiconductor substrate of the following lot.

If the correction counter number N is greater than the data number $N_1$ (or $N=N_1$), then an average value $W_m$ of dimensions W of resist patterns is calculated based on the data number $N_1$ (Step S11). Of data about the dimensions W of resist patters of respective lot numbers, data of lots corresponding to $N_1$ are selected at this time traceably from the latest lot subjected to exposure processing to thereby calculate an average value $W_m$ of the dimensions W of the resist patterns. When the data number $N_1$ is set to 3, for example, an average value $W_m$ is calculated from data about the dimensions W of resist patterns corresponding to 3 lots.

Next, the calculated average value $W_m$ of the dimensions W of the resist patterns and a target dimension $W_T$ are compared. An absolute value ($|W_m-W_T|$) of a drift or shift between the two, i.e., the difference between the calculated average value $W_m$ of the dimensions of the resist patterns and the target dimension $W_T$ is calculated. Then the shift between the average value $W_m$ of the dimensions W of the resist patterns and the target dimension $W_T$ is compared with the set value $R_1$, set value $R_2$ and set value $R_3$ to determine the amount of correction of exposure energy (Step S12). At this time, the determined amount of correction of exposure energy results in any of the following three types.

When the shift or drift between the average value $W_m$ of the dimensions W of the resist patterns and the target dimension $W_T$ is larger than the set value $R_2$ and less than or equal to the set value $R_3$ ($R_2<|W_m-W_T|\leq R_3$), the exposure energy is corrected by the correction value $\alpha_1$ (Step S13). Incidentally, when the average value $W_m$ of the dimensions W of the resist patterns is larger than the target dimension $W_T$ ($W_m>W_T$) at this time, the exposure energy is reduced by the correction value $\alpha_1$. When the average value $W_m$ of the dimensions W of the resist patterns is smaller than the target dimension $W_T$ ($W_m<W_T$), the exposure energy is increased by the correction value $\alpha_1$. Incidentally, this corresponds to a case in which resist patterns (e.g., resist patterns for forming contact holes) for a hole system are formed of a positive type resist film on a semiconductor substrate, and/or a case in which resist patterns (e.g., resist patterns for forming wiring patterns) for a line system are formed of a negative type resist film on a semiconductor substrate (the dimension W of each resist pattern corresponds to the dimension of a line width of each resist pattern). If the positive and negative types, and the hole and line systems are respectively replaced with one another, then the direction in which the exposure energy increases or decreases is reversed. When the correction value $\alpha_1$ is set to 4%, for example, the exposure energy is increased or decreased 4% from the pre-correction amount of exposure energy. When the correction value $\alpha_1$ is set to 50 J, for example, then 50 J is added to or subtracted from the pre-correction amount of exposure energy.

When the drift between the average value $W_m$ of the dimensions W of the resist patterns and the target dimension $W_T$ is larger than the set value $R_1$ and less than or equal to the set value $R_2$ ($R_1<|W_m-W_T|\leq R_2$), the exposure energy is corrected by the correction value $\alpha_2$ (Step S14). Incidentally, when the average value $W_m$ of the dimensions W of the resist patterns is larger than the target dimension $W_T$ ($W_m>W_T$) at this time, the exposure energy is reduced by the correction value $\alpha_2$. When the average value $W_m$ of the dimensions W of the resist patterns is smaller than the target dimension $W_T$ ($W_m<W_T$), the exposure energy is increased by the correction value $\alpha_2$. The direction in which the exposure energy increases or decreases, is similar to the case for the correction value $\alpha_1$. When the correction value $\alpha_1$ is set to 1%, for example, the exposure energy is increased or decreased 1% from the pre-correction amount of exposure energy. When the correction value $\alpha_1$ is set to 20 J, for example, then 20 J is added to or subtracted from the pre-correction amount of exposure energy.

When the drift between the average value $W_m$ of the dimensions W of the resist patterns and the target dimension $W_T$ is less than or equal to the set value $R_1$ ($|W_m-W_T|\leq R_1$), no exposure energy is corrected (Step S15). In this case, the target center flag is set to 1 (Step S16). An exposure center value $E_c$ (corresponding to exposure energy at the time that the target center flag is set from 0 to 1) is automatically set with timing in which the target center flag changes from 0 to b1. Accordingly, the exposure center value $E_c$ corresponds to exposure energy at the time that the (average value $W_m$ of) dimensions W of the resist patterns first falls within the range of the set value (dead zone area) $R_1$.

It is then discriminated whether the target center flag is 1 (Step S17). When the target center flag is 1, it is determined whether the post-correction exposure energy E falls within the range of a margin for the exposure center value $E_c$ (Step S18). The margin for the exposure center value $E_c$ is set by the change amount-of-exposure margin $M_1$. Here, it is discriminated whether the drift or shift between the post-correction exposure energy E and the exposure center value $E_c$ is less than or equal to the change amount-of-exposure margin $M_1$ ($|E-E_c|/E_c \leq M_1$). When, for example, the exposure center value $E_c$ is 1000 J and the change amount-of-exposure margin $M_1$ is 5%, whether the post-correction exposure energy E falls within a range of 950 J to 1050 J, is discriminated. If the post-correction exposure energy E falls within the range of the margin for the exposure center value $E_c$, then the calculated (corrected) exposure energy E is used for processing (exposure processing effected on a semiconductor substrate of the following lot) (Step S19). Thereafter, the correction counter number N is cleared and returned to 1 (Step S20). If the post-correction exposure energy E falls beyond the range of the margin for the exposure center value $E_c$ ($|E-E_c|/E_c > M_1$), then an error is displayed (Step S21). Since there is a possibility that a phenomenon about a drift in dimension W of each resist pattern due to the process or semiconductor manufacturing apparatus would occur when the error is displayed here, the cause thereof is found out and countermeasures against it are taken.

When the target center flag is not 1 (i.e., it is 0), it is discriminated whether the post-correction exposure energy E falls within the range of a margin equal to twice the change amount-of-exposure margin $M_1$ with respect to the amount of exposure $E_s$ at the start of its control (Step S22). Namely, it is determined whether a drift between the post-correction exposure energy E and the amount of exposure $E_s$ at the control start is less than or equal to twice the change amount-of-exposure margin $M_1$ ($|E-E_s|/E_s \leq 2M_1$). If the post-correction exposure energy E falls within this range, then the calculated (corrected) exposure energy E is used for the start of processing (for exposure processing effected on a semiconductor substrate of the following lot) (Step S19). Thereafter, the correction counter number N is cleared and returned to 1 (Step S20). If the post-correction exposure energy E falls beyond the range, then an error is displayed (Step S23). Since there is a possibility that mistakes would be made in setting parameters when an error is displayed here, a check is made for the possibility that a problem occurs in the set parameters, and the parameters are set again as needed.

Then the routine procedure is returned to Step S4 to determine exposure energy for a semiconductor substrate of the further following lot, from which the above steps are repeated. While the exposure energy to be applied is being corrected as needed in this way, the exposure processing is sequentially effected on the resist films on the semiconductor substrates of the respective lots.

As is understand even from the graphs of FIGS. 1 and 2, the exposure energy controlling method corrects the exposure energy every data numbers $N_1$ (3 lots here). However, if the drift between (the average value $W_m$ of) the dimensions W of the resist patterns and the target dimension $W_T$ falls beyond the range of the set value $R_2$, then the exposure energy is corrected with the large correction value $\alpha_1$. If the drift between (the average value $W_m$ of) the dimensions W of the resist patterns and the target dimension $W_T$ falls within the range of the set value $R_2$, then the exposure energy is corrected with the small correction value $\alpha_2$. If the drift between (the average value $W_m$ of) the dimensions W of the resist patterns and the target dimension $W_T$ further falls within the rage of the set value $R_1$, then the exposure center value Ec is registered and an exposure margin interlock function is started. Therefore, the convergence of the dimension W of each resist pattern on the target dimension $W_T$ becomes fast and the dimension W of the resist pattern can be fine-adjusted.

Incidentally, while the two correction values $\alpha_1$ and $\alpha_2$ for the exposure energy are set to correct the exposure energy in the present embodiment, it may also be feasible to set three or more correction values for exposure energy, correct exposure energy with the largest correction value where the dimension of the formed resist pattern is much drifting from the target dimension, and gradually correct exposure energy with small correction values as the dimension of the formed resist pattern approaches the target dimension.

Figure 5:
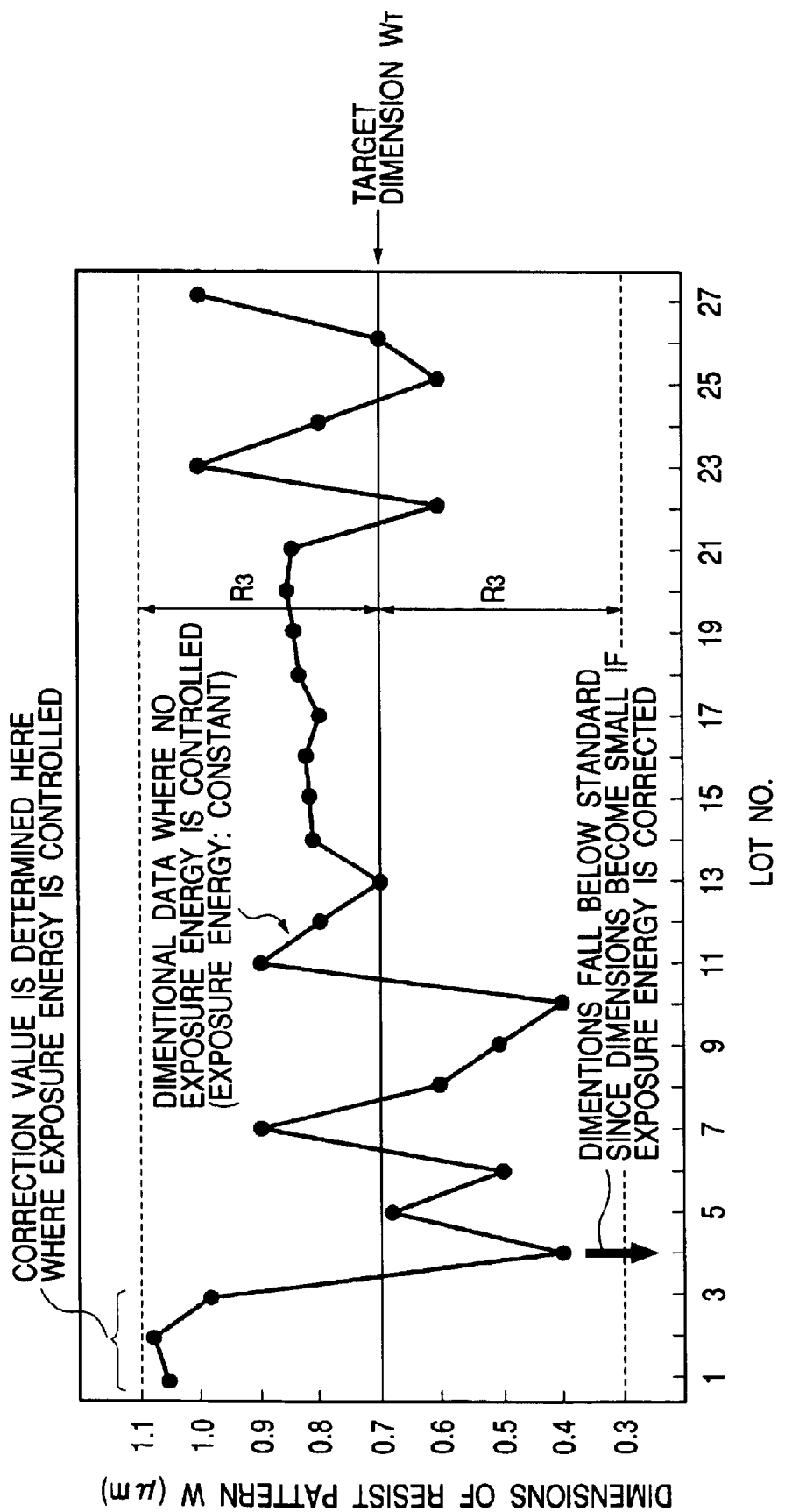
FIG. 5 is a graph showing dimensional data where dimensions of resist patterns vary greatly.

FIG. 5 is a graph showing dimensional data where the dimensions W of the resist patterns greatly vary. The horizontal axis of the graph shown in FIG. 5 corresponds to lot numbers (Lot NOs.) of semiconductor substrates subjected to exposure. The vertical axis of the graph shown in FIG. 5 corresponds to dimensions W of resist patterns formed on the semiconductor substrates of the respective lot numbers in a manner similar to the vertical axis of the graph shown in FIG. 2. Incidentally, FIG. 5 shows data where exposure energy to be applied is kept constant without performing the exposure energy control employed in the present embodiment.

When the dimension W of each resist pattern varies widely as shown in FIG. 5, resist patterns lying below standard are formed in reverse when the exposure energy is automatically controlled, thereby causing the fear that a defective product is created. Assuming that in the graph of FIG. 5 by way of example, an average value $W_m$ is determined from resist pattern dimensions W of initial three lots (Lot NOs. 1 to 3) and the exposure energy is corrected, there is the fear that the dimension W of the resist pattern of the next lot (Lot NO. 4) becomes small as compared with the case in which no correction is made, thus resulting in being below standard. In the present embodiment, a decision as to whether the dimensions W of the resist patterns vary widely, is made based on the Cp value as described above (corresponding to Step S6). If the Cp value is found to be smaller than the $Cp_o$ value, i.e., the dimensions W of the resist patterns vary or fluctuate widely as shown in FIG. 5, the exposure processing is done without automatically correcting the exposure energy. It is thus possible to enhance production yields of a semiconductor device.

Figure 6:
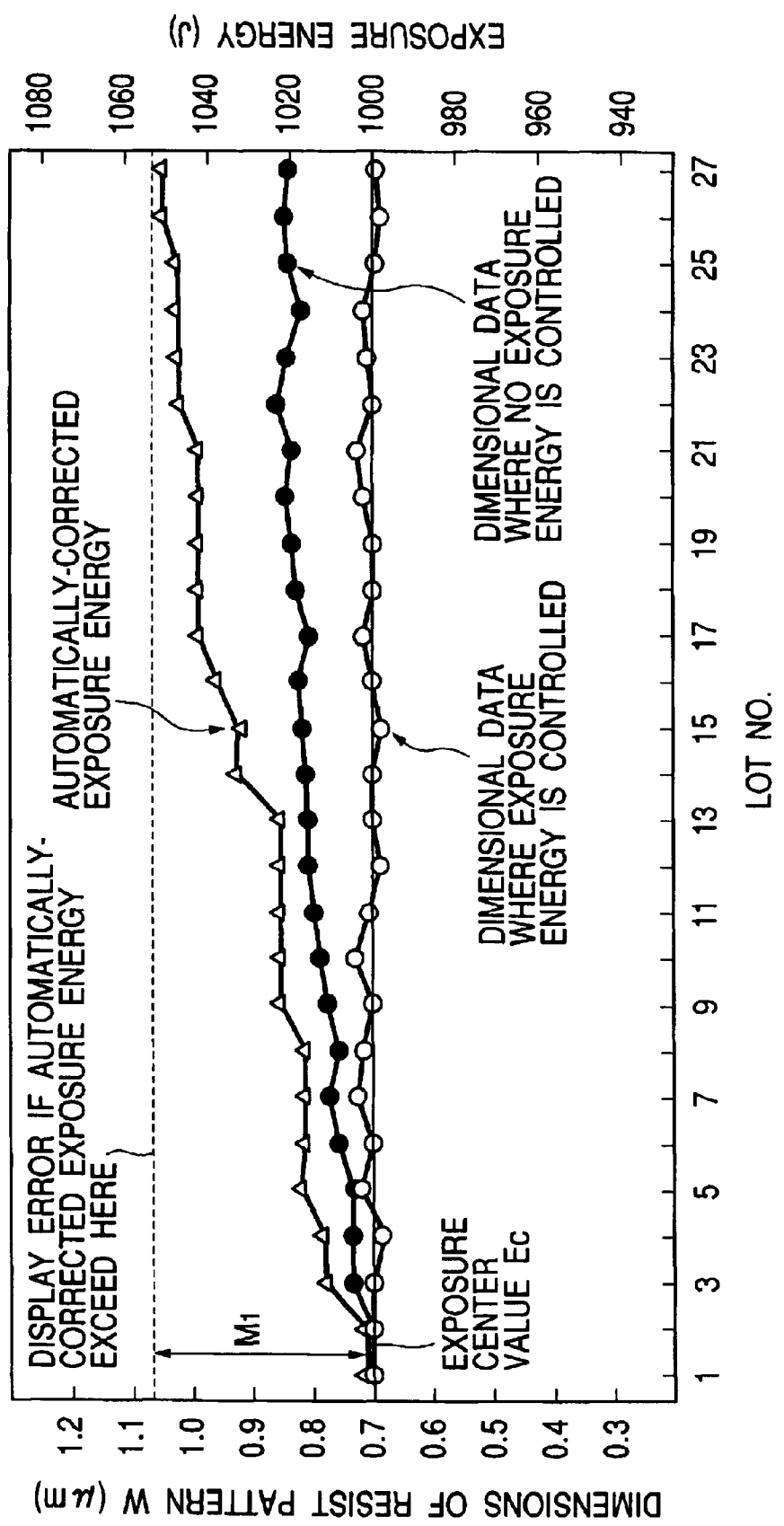
FIG. 6 is a graph for describing an interlock function based on settings of an exposure center value and an amount-of-exposure margin.

FIG. 6 is a graph for describing an interlock function based on settings of an exposure center value $E_c$ and an amount-of-exposure margin $M_1$. The horizontal axis of the graph shown in FIG. 6 corresponds to lot numbers (Lot NOs.) of semiconductor substrates subjected to exposure.

The vertical axis of the graph shown in FIG. 6 corresponds to dimensions W of resist patterns formed on the semiconductor substrates of the respective lots, and exposure energy applied to the semiconductor substrates of the respective lots. White triangles in the graph of FIG. 6 correspond to exposure energy applied to the semiconductor substrates while the exposure energy control (correction) employed in the present embodiment is being performed, and white circles in the graph shown in FIG. 6 correspond to dimensions W of resist patterns formed thereby. Black circles in the graph of FIG. 6 correspond to dimensions W of resist patterns formed where the exposure energy control (correction) employed in the present embodiment is not performed (where the exposure energy is constant).

There may be a case in which when the exposure energy is held constant as shown in FIG. 6, the resist pattern dimensions W drift (they are shifted in a constant direction) (see the black circles in the graph of FIG. 6). This raises the possibility of a drift phenomenon caused by the process or semiconductor manufacturing apparatus. When such a phenomenon occurs, there is a need to find out the fundamental cause thereof and take countermeasures against it. There is however the fear that as shown in FIG. 6, when the exposure energy is continuously controlled, the exposure energy is corrected (the exposure energy is drifted) so that the dimension W of each resist pattern remains converged on the neighborhood of the target dimension $W_T$ without drifting, whereby the above phenomenon caused by the process or semiconductor manufacturing apparatus is unnoticed. However, in the present embodiment as described above, the interlock function based on the setting of the exposure center value $E_c$ and the amount-of-exposure margin $M_1$ is added, and the error display is performed when the post-correction exposure energy is drifted the change amount-of-exposure margin $M_1$ or more from the exposure center value $E_c$ (drifted 5% or more, for example). It is therefore possible to detect the potential that the drift phenomenon of the dimensions W of the resist patterns caused by the semiconductor manufacturing apparatus has been developed, and find out the cause thereof to take countermeasures against it.

In the present embodiment, the correction value $\alpha_1$ is set to the large value of the order free of divergence, and the correction value $\alpha_2$ is set to the relatively small value capable of fine-adjusting the dimension of each resist pattern ($\alpha_1 > \alpha_2$). Thus, when the drift between the dimension of each formed resist pattern and the target dimension is large (it is larger than the set value $R_2$), the correction value (correction rate or the amount of correction) for the exposure energy is enlarged. When the drift between the dimension of the formed resist pattern and the target dimension is small (it is smaller than the set value $R_2$), the correction value (correction rate or the amount of correction) for the exposure energy is reduced. Therefore, the convergence of the dimension of each resist pattern on the target dimension becomes fast and a fine-adjustment to the dimension of the resist pattern can also be made. Accordingly, the dimensional accuracy of the resist pattern can be enhanced. It is also possible to stably fabricate resist patterns lying within a predetermined standard. Thus, a semiconductor device having high-accuracy circuit patterns can stably be formed, the reliability of the semiconductor device can be improved, and production yields thereof can be reduced. Also the time required to fabricate the semiconductor device can be shortened. Since changes in set parameter may be less reduced even for production lines on which a small volume and wide variety of semiconductor devices are mass-produced, a semiconductor device manufacturing process suitable for mass production can be realized.

There is the fear that when dimensional data about each resist pattern is determined at one point, a varying disturbance in the set threshold value is picked up and a proper correction cannot be performed. Since the data number $N_1$ for obtaining the average value $W_m$ of the dimensions W of the resist patterns is used and the correction is determined on the average of the $N_1$ data numbers (number of lots) in the present embodiment, the disturbance-based influence can be suppressed.

Owing to the introduction of the logic for determining using the correction counter whether the correction is enough after the correction has been done once, high-accuracy control on the amount of exposure energy is enabled.

Since variations in the dimension W of the resist pattern are determined by calculation of the Cp value, and whether or not the correction should be done is determined according to the degree of their variations, it is possible to suppress the divergence of the dimensions W of the resist patterns.

The exposure center value $E_c$ is set so as to have a margin, thereby making it possible to detect the drift phenomenon of the dimensions W of the resist patterns, which is caused by the process or semiconductor manufacturing apparatus. Further, the exposure center value $E_c$ is set so as to have the margin to thereby make it possible to detect a mistake in the setting of each parameter.

Figure 7:
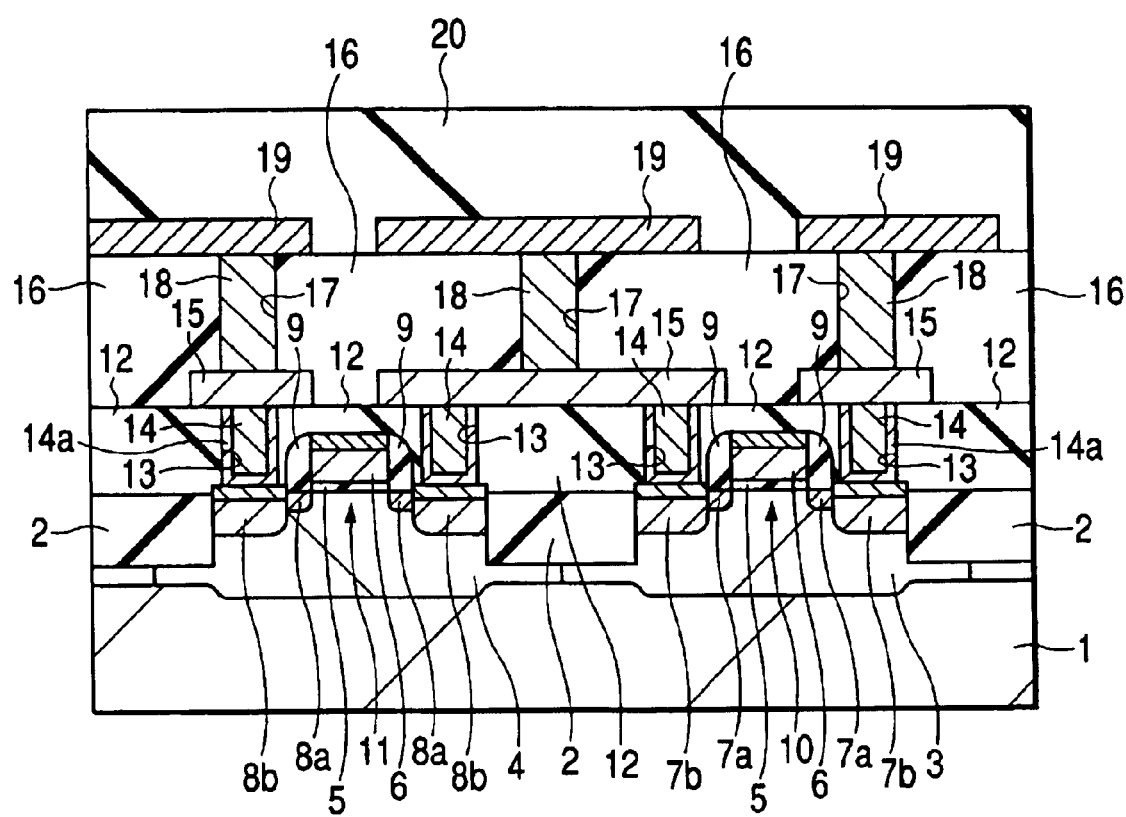
FIG. 7 is a fragmentary cross-sectional view of a semiconductor device in a semiconductor device manufacturing process showing one embodiment of the present invention.

A process for manufacturing a semiconductor device using the photolithography process steps using the above exposure energy controlling method will next be described. FIG. 7 is a fragmentary cross-sectional view of a semiconductor device, e.g., a CMISFET (Complementary Metal Insulator Semiconductor Field Effect Transistor) in its manufacturing process according to one embodiment of the present invention. While a description will be made here of a case in which a semiconductor chip or element is formed on one semiconductor substrate (semiconductor wafer) to thereby fabricate a semiconductor device, semiconductor elements can respectively be formed even on other semiconductor substrates in the same manner as described above to thereby fabricate semiconductor devices.

As shown in FIG. 7, device isolation regions 2 are formed on a main surface of a semiconductor substrate (semiconductor wafer) 1 made up of p-type monocrystal silicon or the like having a specific resistivity ranging from about 1 Ωcm to about 10 Ωcm, for example. The device isolation regions 2 are made of silicon oxide or the like and formed by, for example, an STI (Shallow Trench Isolation) method or a LOCOS (Local Oxidization of Silicon) method or the like.

Next, a p-type well 3 and an n-type well 4 are formed over a predetermined depth from the main surface of the semiconductor substrate 1. The p-type well 3 is formed by, for example, ion-implantation of an impurity such as boron or the like, and the n-type well 4 is formed by, for example, ion-implantation of an impurity such as phosphor or the like.

Next, a gate insulating film 5 is formed on the surface of each of the p-type well 3 and the n-type well 4. The gate insulating film 5 is made up of, for example, a thin silicon oxide film or the like and can be formed by, for example, a thermal oxidation method or the like.

Next, gate electrodes 6 are formed on their corresponding gate insulating films 5 of the p-type well 3 and the n-type well 4. The gate electrodes 6 can be formed by, for example, laminating a polycrystal silicon film having low resistance and a titanium silicide ($TiSi_x$) layer or a cobalt silicide ($CoSi_x$) layer on their corresponding gate insulating films 5 and patterning them by using a photolithography method and an etching method.

Next, the impurity such as phosphor or the like is ion-implanted into regions on both sides of the gate electrode 6 of the p-type well 3 to form n⁻ type semiconductor regions 7a. The impurity such as boron or the like is ion-implanted into regions on both sides of the gate electrode 6 of the n-type well 4 to form p⁻ type semiconductor regions 8a.

Next, sidewall spacers or sidewalls 9 made of silicon oxide or the like are formed on their corresponding sidewalls of the gate electrodes 6. After the formation of the sidewalls 9, n⁺ type semiconductor regions 7b (source and drain) are formed by, for example, ion-implanting an impurity such as phosphor or the like into regions on both sides of the gate electrode 6 of the p-type well 3 and the sidewalls 9. p⁺ type semiconductor regions 8b (source and drain) are formed by, for example, ion-implanting an impurity such as boron or the like into regions on both sides of the gate electrode 6 of the n-type well 4 and the sidewalls 9. The n⁺ type semiconductor regions 7b are higher than the n⁻ type semiconductor regions 7a in impurity concentration, and the p⁺ type semiconductor regions 8b are higher than the p⁻ type semiconductor regions 8a in impurity concentration.

Thus, an n channel type MISFET (Metal Insulator Semiconductor Field Effect Transistor) 10 and a p channel type MISFET 11 are formed.

Next, an insulating film 12 is formed over the semiconductor substrate 1 so as to cover the gate electrodes 6 and the sidewalls 9. The insulating film 12 is made up of an insulating film high in reflowability, e.g., a BPSG (Boron-doped Phospho Silicate Glass) film or the like capable of burying a narrow space defined between the gate electrodes 6, for example.

Then, contact holes 13 are defined in the insulating film 12 by a photolithography method and an etching method. Parts of the main surface of the semiconductor substrate 1, e.g., parts of the n⁺ type semiconductor regions 7b and p⁺ type semiconductor regions 8b, parts of the gate electrodes 6, etc. are exposed at the bottoms of the contact holes 13.

In the process of forming the contact holes 13, a resist film is formed on the insulating film 12 and exposed and developed, followed by its patterning. With each formed resist pattern as an etching mask, the insulating film 12 is etched to form the contact holes 13. At this time, exposure energy may preferably be adjusted using the above control method to control the dimension of each resist pattern. Thus, the dimensional accuracy of each contact hole 13 is improved.

Next, plugs 14 made of tungsten (W) or the like are formed within their corresponding contact holes 13. The plug 14 is formed by, for example, forming, e.g., a titanium nitride film 14a on the insulating film 12 containing the interior of the contact hole 13 as a barrier film, thereafter forming a tungsten film on the titanium nitride film 14a by a CVD (Chemical Vapor Deposition) method so as to bury the contact hole 13, and removing the unnecessary tungsten film and titanium nitride film 14a on the insulating film 12 by a CMP (Chemical Mechanical Polishing) method or an etchback method or the like.

Next, each wiring (wiring pattern) 15 made of, for example, tungsten or the like is formed on the insulating film 12 by which the plug 14 is buried, as a first layer wiring. The wirings 15 can be formed by forming a tungsten film or the like on the insulating film 12 and patterning it by the photolithography method and the etching method. The wirings 15 are respectively electrically connected to the semiconductor regions 7b and 8b for the sources/drains of the n channel type MISFET 10 and p channel type MISFET 11 and the gate electrodes 6 through the plugs 14. The wiring 15 is not limited to tungsten, and changes can be made thereto in various ways. The wiring 15 may be formed as a laminated metal film obtained by forming a metal film like titanium (Ti), titanium nitride (TiN) or the like on a unitary film such as aluminum (Al) or an aluminum alloy or the like, or at least one of upper and lower layers of these unitary films.

Next, an insulating film 16 is formed on the insulating film 12 so as to cover the wirings 15. Thereafter, vias or through holes 17 for exposing parts of the wirings 15 are defined in the insulating film 16 in a manner similar to the contact holes 13. Plugs 18 for burying the through holes 17, and wirings 19 each used as a second layer wiring, which are electrically connected to their corresponding wirings 15 through the plugs 18, are formed in a manner similar to the plugs 14 and wirings 15. An insulating film 20 is formed on the insulting film 16 so as to cover the wirings 19.

Thereafter, vias or through holes for exposing parts of the wirings 19 are defined in the insulating film 20 in a manner similar to the through holes 17 although their illustrations are omitted. Although omitted from the drawing, plugs for burying the through holes, and upper wirings or the like electrically connected to the wirings 19 through the plugs are formed as needed in a manner similar to the plugs 18 and wirings 19.

Such a semiconductor device manufacturing process includes a number of photolithography process steps inclusive of photolithography process steps not described in particular. In such photolithography process steps, resist patterns having desired dimensions are appropriately formed on respective semiconductor substrates while correcting exposure energy applied to the semiconductor substrates (semiconductor wafers) according to the exposure energy controlling method. Although the exposure energy controlling method can also be applied to all of the photolithography process steps, the exposure energy controlling method may be applied to only the arbitrary process steps (single or plural) of all the photolithography process steps. Further, if the exposure energy controlling method is applied to a photolithography process step for forming resist patterns for a hole system, e.g., a photolithography process step for forming contact holes or through holes, then a great effect is particularly brought about. The exposure energy controlling method is effective if applied to a photolithography process step or the like for forming wiring patterns or the like.

While the invention developed above by the present inventors has been described specifically based on the illustrated embodiments thereof, the present invention is not limited to the embodiments. It is needless to say that various changes can be made thereto within the scope not departing from the substance thereof.

While the embodiment has described the manufacturing process of the semiconductor device having the CMISFET, the present invention is not limited to it. The present invention can be applied to various semiconductor device manufacturing processes having photolithography process steps.

An advantageous effect obtained by a representative one of the inventions disclosed in the present application will be explained in brief as follows:

When the dimension of each formed resist pattern is much drifting from a target dimension, the amount or rate of exposure energy to be corrected is increased. After the dimension of the formed resist pattern has approached the target dimension, the amount or rate of exposure energy to be corrected is reduced, whereby resist patterns with dimensions falling within a predetermined standard can be stably fabricated.

What is claimed is:

1. A method of manufacturing a semiconductor device, comprising the steps of:
   (a) effecting exposure processing on a resist film on a first semiconductor substrate with first exposure energy; and
   (b) correcting the first exposure energy with a first correction value when a drift of each of dimensions of resist patterns formed on the first semiconductor substrate from a target dimension is larger than a first value, correcting the first exposure energy with a second correction value smaller than the first correction value when the drift is smaller than the first value, and effecting exposure processing on a resist film on a second semiconductor substrate with the corrected exposure energy.

2. A method of manufacturing a semiconductor device, comprising the steps of:
   (a) effecting exposure processing on a resist film on a first semiconductor substrate with first exposure energy; and
   (b) correcting the first exposure energy with a first correction value when a drift of each of dimensions of resist patterns formed on a first semiconductor substrate from a target dimension is larger than a first value, correcting the first exposure energy with a second correction value smaller than the first correction value when the drift is smaller than the first value and larger than a second value, effecting exposure processing on a resist film on a second semiconductor substrate with the corrected exposure energy, and effecting exposure processing on the resist film on the second semiconductor substrate with the first exposure energy when the drift is smaller than the second value.

3. A method of manufacturing a semiconductor device, comprising the steps of:
   (a) effecting exposure processing on resist films on a plurality of semiconductor substrates with first exposure energy respectively; and
   (b) correcting the first exposure energy with a first correction value when an average value of drifts of dimensions of resist patterns formed on the plurality of semiconductor substrates from a target dimension is larger than a first value, correcting the first exposure energy with a second correction value smaller than the first correction value when the average value of the drifts is smaller than the first value, and effecting exposure processing on a resist film on a semiconductor substrate different from the plurality of semiconductor substrates with the corrected exposure energy.

* * * * *